United States Patent [19]

Endo

[11] Patent Number: 4,950,427
[45] Date of Patent: Aug. 21, 1990

[54] TRANSISTOR DEVICE

[75] Inventor: Kazuo Endo, Yokohama, Japan

[73] Assignee: Kabushiki Kaisha Toshiba, Kawasaki, Japan

[21] Appl. No.: 233,508

[22] Filed: Aug. 18, 1988

[30] Foreign Application Priority Data

Aug. 21, 1987 [JP] Japan .................. 62-207539

[51] Int. Cl.⁵ .................. H01L 23/28; H01L 23/48
[52] U.S. Cl. .................. 357/72; 357/80; 357/81
[58] Field of Search .................. 357/81, 80, 72, 65, 357/68

[56] References Cited

U.S. PATENT DOCUMENTS 3,829,598  8/1974  Darnell .................. 174/15 R
4,482,913 11/1984  Burke et al. .................. 357/67

FOREIGN PATENT DOCUMENTS 0069390 12/1983 European Pat. Off. .
2084796A 4/1982 United Kingdom .

OTHER PUBLICATIONS

Y. Kurokawa et al., "AIN Substrates with High Thermal Conductivity", IEEE Transactions on Components, Hybrids and Manufacturing Technology, vol. CHMT-8, No. 2, Jun. 1985, pp. 247-252.

Primary Examiner—James W. Davie
Attorney, Agent, or Firm—Finnegan, Henderson, Farabow, Garrett, and Dunner

[57] ABSTRACT

A transistor comprising a radiator plate continuous to a base terminal, a plate member made of thermally conductive material, and secured on the radiator plate, a transistor pellet secured on the plate member, a metal lead wire for connecting a base electrode of the transistor pellet to the radiator plate, and a metal lead wire for connecting the upper side of the plate member to the collector terminal.

2 Claims, 2 Drawing Sheets

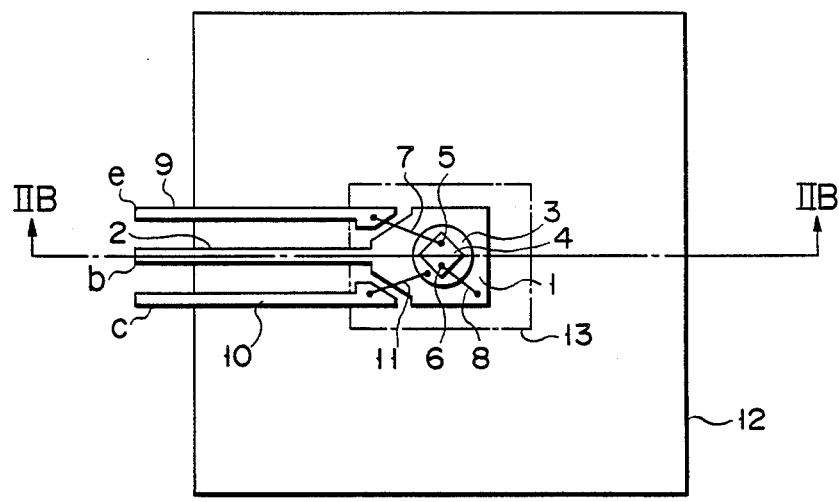
F I G. 2A
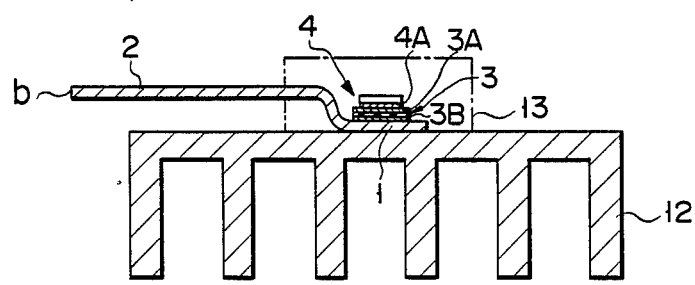
F I G. 2B

TRANSISTOR DEVICE

BACKGROUND OF THE INVENTION

1. Field of the Invention

This invention relates to a transistor device, and more particularly to improvements of the mount structure of a bi-polar transistor pellet.

2. Description of the Related Art

A conventional bi-polar transistor is structured as shown in FIGS. 1A and 1B. As shown, square plate 21 made of insulating material is fixed onto metal heat sink 20. Radiator plate 22 is further fixed on insulating square plate 21. The bottom surface of 23A of transistor pellet 23 is secured on the upper surface of radiator plate 22. The bottom surface of pellet 23 serves as a collector electrode. A narrow lead terminal continuously extending from radiator plate 22 is used as collector terminal 24. A couple of lead terminals, which are located on both sides of collector terminal 24, are used as emitter and base terminals 25 and 26, respectively. These terminals 25 and 26 are connected via metal lead wires 27 and 28 to emitter and base electrodes 29 and 30 of transistor pellet 23, respectively. Enclosure 31 hermetically encloses radiator plate 22, transistor pellet 23, lead terminals 24, 25 and 26, and metal lead wires 27 and 28. These lead terminals 24 to 26 are partially extended outside from the enclosure, as shown. Enclosure 31 is made of resin mold and i provided for protecting those elements from outside.

To use the transistor device in a grounded-base or common-base connection mode, base terminal 26 and heat sink 20 are electrically interconnected by means of an electrical conductive member (not shown). In this common-base connection mode, a feedback capacitance Cob between the collector and the base of the transistor device is the sum of capacitances Cob1 and Cob2. The capacitance Cob1 exists between the collector electrode and the base electrode, which are both on transistor pellet 23. The capacitance Cob2 exists between radiator plate (collector) 22 and heat sink (base) 20. The capacitance Cob1 between the collector and base electrodes on pellet 23 is approximately 4 pF, in the case of transistor whose breakdown voltage is 100 V or more, and saturation collector current is 200 mA. The capacitance Cob2 between radiator plate 22 and heat sink 20 depends on the size of radiator plate 22, and the material, thickness, and dielectric constant of insulating square plate 21. For example, the size of radiator plate 22 is 4×5 mm. The square plate 21 is made of boron nitride, 1 mm thick, and 8.1 in dielectric constant. The feedback capacitance Cob2 is approximately 14.33 pF. Hence, the capacitance Cob is 18.33 pF=4 pF+14.33 pF.

Some circuits often require use of the transistor devices with a small feedback capacitance Cob. A typical example of such circuits is a high frequency output circuit, e.g., an ultra-fine video signal output circuit. This circuit uses the transistor in a cascode fashion. In this circuit, to obtain the specified cutoff frequency, the feedback capacitance must be small, 5 pF or less. One of the conventional approaches to reduce the feedback capacitance Cob is to increase the thickness of insulating square plate 21. However, a figure of the feedback capacitance as attained by the approach fails to reach the 5 pF or less. For example, when thickness of square plate 21 is increased to 5 mm, the capacitance Cob2 between radiator plate 22 and heat sink 20 is approximately 2.8 pF, and the feedback capacitance Cob is approximately 6.8 pF at most. The approach involves an additional problem. Use of boron nitride for this insulating square plate 21 of 5 mm thick would increase the cost to manufacture.

SUMMARY OF THE INVENTION

Accordingly, an object of this invention is to provide a transistor device in which the feedback capacitance is satisfactorily small, and the insulating plate used is inexpensive.

According to the present invention, there is provided a transistor device comprising:

a base terminal;

an emitter terminal;

a collector terminal;

a radiator plate continuous to said base terminal;

a plate member made of thermal conductive insulating material, and secured on said radiator plate, the upper and lower sides of said plate member being metallized;

a transistor pellet, the bottom surface of said transistor pellet being secured on said plate member, said bottom surface serving as a collector electrode;

a metal lead wire for connecting a base electrode of said transistor pellet to said radiator plate;

a metal lead wire for connecting the upper side of said plate member to the collector terminal; and an enclosure made of mold resin hermetically enclosing said respective elements, while said base, emitter and collector terminals of those elements being partially extended outside said enclosure.

In the transistor device with such a mount structure, the base is made of the radiator plate. The radiator plate is directly connected to the heat sink. This structural feature provides a high heat radiation. The transistor device featured by such is suitable for the common-base connection circuit. A value of the capacitance Cob between the collector and base electrodes on the transistor pellet is approximately equal to that of the conventional transistor device. The capacitance Cob2 between the radiator plate (base) and the the surface (collector) of the transistor pellet may be made small, e.g., 0.4 pF, if the area and the thickness of the thermal conductive insulating member are properly selected. Therefore, the feedback capacitance Cob as the sum of Cob1 and Cob2 is 4.4 pF, and below the required figure 5 pF. Additionally, the thermal conductive insulating member may be made small, e.g., 3 mm$\phi$ in area, and thin up to about 1 mm, if the transistor pellet can be mounted on this insulating member, and the insulating member and the collector terminal can be bonding connected by a metal lead wire. Therefore, use of inexpensive member is allowed, leading to cost reduction of the transistor device manufactured.

In short, the present invention has been achieved from the requirements that the size of the expensive insulating film and capacitance Cob2 between the collector electrode and the heat sink be minimized. In order to realize the requirements, the present inventor has paid an attention to the fact that, when the device is used as a common-base connection circuit, the base electrode is necessarily connected to the heat sink by a wire. Upon study, the inventor has realized the requirements by such a technical idea that radiator plate is used as a base electrode terminal and directly connected on the heat sink, and furthermore, the transistor pellet is located on a thermal conductive insulating film which is located on the radiator plate. With this structure, no large insulation film between the radiator plate and the hat sink is necessary, reducing capacitance Cob2 between the radiation plate and the heat sink. Furthermore, the thermal conductive insulating film can be small since it receives only the small transistor pellet. Therefore, capacitance Cob1 between the collector base electrodes of the transistor pellet is small. In this way, a transistor device satisfying the requirement has been realized.

BRIEF DESCRIPTION OF THE DRAWINGS

FIG. 2A shows a plan view illustrating roughly a layout of a transistor device according to an embodiment of this invention; and FIG. 2B shows a sectional view taken on line IIB—IIB in FIG. 2B.

DETAILED DESCRIPTION OF THE PREFERRED EMBODIMENT

Figure 1A:
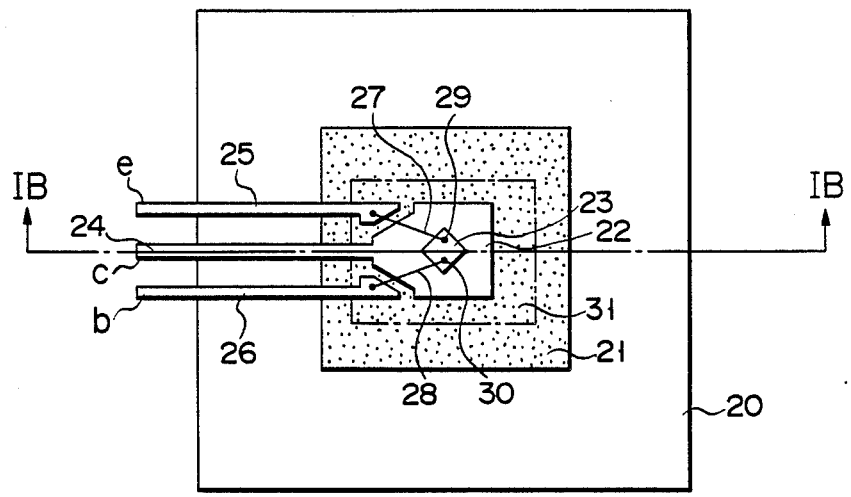
FIG. 1A shows a plan view illustrating roughly a layout of a transistor device of the prior art.
Figure 1B:
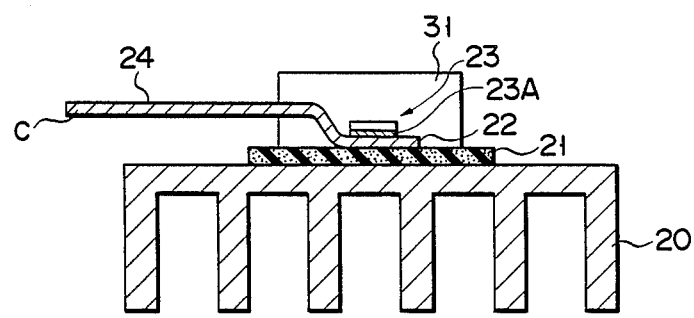
FIG. 1B shows a sectional view taken on line IB—IB in FIG. 1A.

A preferred embodiment of a transistor device according to this invention will be described referring particularly to FIGS. 2A and 2B.

In the figures, radiator plate 1 is continuous to a narrow lead terminal constituting base terminal 2. A thermal conductive insulating member designated by reference numeral 3 is bonded on radiator plate 1 by soldering, for example. The insulating member 3 is shaped circular, for example. The upper and lower surfaces 3A and 3B of circular insulating member 3 are metallized. Insulating member 3 is made of beryllium oxide, aluminum nitride, silicon carbide, or any other suitable material. Geometrically, it may be 1 mm in thickness and 3 mm$\phi$ in diameter. The pellet of the bi-polar transistor designated by reference numeral 4 is bonded at its bottom surface 4A on insulating member 3, by soldering, for example. The size of pellet 4 is 1×1 mm, for example. The bottom or lower surface 4A of pellet 4 serves as a collector electrode. Emitter and base electrodes 5 and 6 are formed on the upper surface of pellet 4. Emitter and base electrodes 5 and 6 are respectively connected to a lead terminal as emitter terminal 9 and radiator plate 1, via metal lead wire 7 and 8. The metallized upper surface 3A of insulating member 3 and a lead terminal as collector terminal 10 are interconnected by metal lead wire 11. Radiator plate 1 is directly bonded on heat sink 12 by soldering, for example. All the elements except heat sink 12 are hermetically housed in mold resin enclosure 13. The lead terminals are partially enclosed in enclosure 13, and extend outside from enclosure 13. These extensions are used as base terminal 2, emitter terminal 9, and collector terminal 10, respectively.

It is noted here that in the transistor device with the mount structure thus arranged, heat sink 12 is directly connected to radiator plate 2 serving as the base. Therefore, heat can effectively be radiated from the transistor. The transistor device is very suitable for the common-base connection circuit. Let us consider a specific example of the transistor device thus structured. In this instance, transistor pellet 4 is specified by 100 V or more of the breakdown voltage and 200 mA of the saturation collector current, as in the prior art instance. The capacitance Cob1 between the collector electrode and the base electrode is approximately 4 pF. This figure is equal to that of the prior art instance. The capacitance Cob2 existing between the rear side (collector) of pellet 4 and radiator plate (base) 1, depends on the area and thickness of circular plate 3 made of thermal insulating material. The circular plate 3 is made of beryllium oxide, and its geometry is 3 mm$\phi$ in diameter and 1 mm in thickness. The feedback capacitance Cob1 between the collector and base of the transistor device is approximately 4.4 pF as the sum of 4 pF and 0.4 pF. This figure sufficiently fulfills the requirement of 5 pF or less of the transistor when it is assembled into the video signal output circuit. The 5 pF figure is needed in order to secure the required cutoff frequency in the video signal output circuit.

Geometry of insulating circular plate 3 of 3 mm$\phi$ and 1 mm thick suffices if the pellet 4 of 1 mm square, for example, can be mounted on circular plate 3 and the bonding between circular plate 3 and collector terminal 3 by metal wire 11 is allowed. A less cost of the material for insulating plate 3 is required, leading to the cost reduction of the whole transistor device. This is distinguished when compared with that of the prior art device.

As seen from the foregoing description, the present invention has successfully provided a transistor device remarkably improved in that the cost to manufacture is low, and the collector-base feedback capacitance is below 5 pF. The transistor device according to this invention may suitably be used for the high frequency circuits requiring 5 pF or less of the feedback capacitance.

What is claimed is:
1. A transistor device comprising:
   a base terminal;
   an emitter terminal;
   a radiator plate continuous to said base terminal;
   a plate member made of thermal conductive material, and secured on said radiator plate, the upper and lower sides of said plate member being metallized;
   a transistor pellet, the bottom surface of said transistor pellet being secured on said plate member, said bottom surface serving as a collector electrode;
   a metal lead wire for connecting a base electrode of said transistor pellet to said radiator plate;
   a metal lead wire for connecting an emitter electrode of said transistor pellet to the emitter terminal;
   a metal lead wire for connecting the upper side of said plate member to the collector terminal; and
   an enclosure made of mold resin hermetically enclosing said respective elements, while said base, emitter and collector terminals of those elements being partially extended outside said enclosure.
2. The transistor device according to claim 1, in which said plate member is made of one of beryllium oxide, aluminum nitride and silicon carbide.

* * * * *